(12) United States Patent
Seyama

(10) Patent No.: US 10,340,163 B2
(45) Date of Patent: Jul. 2, 2019

(54) MOUNTING APPARATUS

(71) Applicant: SHINKAWA LTD., Tokyo (JP)

(72) Inventor: Kohei Seyama, Tokyo (JP)

(73) Assignee: SHINKAWA LTD., Tokyo (JP)

(*) Notice: Subject to any disclaimer, the term of this patent is extended or adjusted under 35 U.S.C. 154(b) by 0 days.

(21) Appl. No.: 15/624,717

(22) Filed: Jun. 16, 2017

(65) Prior Publication Data

US 2017/0309503 A1 Oct. 26, 2017

Related U.S. Application Data

(63) Continuation of application No. PCT/JP2015/080006, filed on Oct. 23, 2015.

(30) Foreign Application Priority Data

Dec. 16, 2014 (JP) .................................. 2014-254316

(51) Int. Cl.
*H01L 21/67* (2006.01)
*H01L 23/00* (2006.01)
(Continued)

(52) U.S. Cl.
CPC .. *H01L 21/67144* (2013.01); *H01L 21/67259* (2013.01); *H01L 24/78* (2013.01);
(Continued)

(58) Field of Classification Search
None
See application file for complete search history.

(56) References Cited

U.S. PATENT DOCUMENTS 5,854,460 A * 12/1998 Graf ................... B23K 26/0884
219/121.67
7,726,546 B2 * 6/2010 Maeda ................. B23K 1/0016
228/180.22

(Continued)

FOREIGN PATENT DOCUMENTS

JP 2007163451 6/2007
JP 2008212922 9/2008
(Continued)

OTHER PUBLICATIONS

Office Action of China Counterpart Application, with English translation thereof, dated Mar. 26, 2019, pp. 1-18.

*Primary Examiner* — Reema Patel
*Assistant Examiner* — Steven M Christopher
(74) *Attorney, Agent, or Firm* — JCIPRNET

(57) ABSTRACT

The disclosure shows a mounting apparatus including a primary pedestal with a mounting stage installed thereon, a gantry frame supported on the primary pedestal, mounting heads supported on the gantry frame in a manner movable in the Y direction, a secondary pedestal arranged apart from the primary pedestal, and a Y-direction load receiver installed on the secondary pedestal in a manner movable in the X direction and immovable in the Y direction, in which an X-direction stator is attached to the secondary pedestal, and in which one end of a Y-direction stator attached to the gantry frame and the Y-direction load receiver are connected using a connection member, thereby suppressing vibration of the primary pedestal caused when the plurality of mounting heads are moved in the X and Y directions.

9 Claims, 5 Drawing Sheets

(51) Int. Cl.
*H02K 41/02* (2006.01)
*H02K 41/03* (2006.01)
*H05K 13/04* (2006.01)
*H02K 11/21* (2016.01)

(52) U.S. Cl.
CPC ........... H02K 41/02 (2013.01); H02K 41/031 (2013.01); H05K 13/0406 (2018.08); *H01L 2224/78824* (2013.01); *H01L 2224/78901* (2013.01); *H01L 2224/78981* (2013.01); *H02K 11/21* (2016.01); *H02K 2201/18* (2013.01)

(56) References Cited

U.S. PATENT DOCUMENTS

2002/0047355 A1* 4/2002 Hwang .................. H02K 41/03
310/68 C
2012/0057140 A1* 3/2012 Aoki .................. G03F 7/70716
355/53

FOREIGN PATENT DOCUMENTS

| JP | 2010120003 | 6/2010 |
| JP | 2013066833 | 4/2013 |
| JP | 2014187157 | 10/2014 |

* cited by examiner

MOUNTING APPARATUS

CROSS-REFERENCE TO RELATED APPLICATIONS

This application is a Continuation of PCT International Application No. PCT/JP2015/080006 filed on Oct. 23, 2015, which claims priority under 35 U.S.C §119(a) to Japanese Patent Application No. 2014-254316 filed on Dec. 16, 2014. Each of the above application(s) is hereby expressly incorporated by reference, in its entirety, into the present application.

TECHNICAL FIELD

The present invention relates to a structure of a mounting apparatus.

BACKGROUND ART

In mounting apparatus for wire-connecting electrodes on a semiconductor die and electrodes on a substrate, a BH moving device is used to move a bonding head (BH) in the X and Y directions (orthogonal to each other in a horizontal plane). Also, in some wire bonding apparatuses, a stage moving device or the like is used to move a bonding stage for sucking a wafer thereon in the XY directions. In such apparatuses, devices are often used that use, for example, a ball screw or a voice coil motor to move the BH or the stage in the XY directions.

In contrast, methods of using a linear motor to move a stage in the XY directions have recently been proposed (see Patent document 1, for example). In the stage apparatus described in Patent document 1, a mover of a linear motor is attached to a stage arranged to slide back-and-forth on a work placement table, while a stator of the linear motor is fixed to a secondary pedestal different from the work placement table, the secondary pedestal being arranged to receive a reaction force applied to the stator when the stage is moved by the linear motor, so that vibrations during movement of the stage cannot be transmitted to the work placement table, resulting in proposing a method of reducing vibrations of the work during processing for improvement in the processing accuracy.

There is also proposed a paste applying apparatus arranged to apply paste for bonding of electronic components on the surface of a substrate, the apparatus including two Y-axis moving devices arranged on a pedestal, two support members arranged to be moved by the Y-axis moving devices in the Y direction, X-axis moving devices attached to the respective support members, and multiple application heads attached to the X-axis moving devices, in which application patterns different among the heads for each of the support members are drawn (see FIG. 1 in Patent document 2, for example).

CITATION LIST

Patent Document

Patent document 1: JP4554559B
Patent document 2: JP4400836B

SUMMARY OF INVENTION

Technical Problem

Incidentally, there has recently been a demand for increase in the rate of mounting and the efficiency through provision of multiple mounting heads and separate movements of the respective mounting heads in the XY directions to mount multiple types of electronic components simultaneously at different locations on a single substrate. In the cases above, the technique described in Patent document 1 suffers from a problem of inapplicability to movements in the XY directions, though accommodating movements in either the X or Y direction. Also, using such an XY drive mechanism as described in Patent document 2 may cause vibrations generated during movements of multiple mounting heads to interfere with each other, which in turn causes a vibration of a pedestal on which a mounting stage is carried, resulting in a decrease in the mounting accuracy.

The present invention provides a mounting apparatus for moving multiple mounting heads in the XY directions, in which the vibration of a primary pedestal with a mounting stage installed thereon can be reduced. In the mounting apparatus for moving multiple mounting heads in the XY directions, the present invention reduces the effect of movement of one of the mounting heads on the positions of the other mounting heads.

Solution to Problem

A mounting apparatus according to the present invention includes a primary pedestal with a mounting stage installed thereon, a gantry frame extending in a Y direction across the primary pedestal with the ends thereof supported on the primary pedestal in a manner movable in an X direction, a mounting head supported on the gantry frame in a manner movable in the Y direction, an X-direction linear motor for driving the gantry frame in the X direction, a Y-direction linear motor for driving the mounting head in the Y direction, a secondary pedestal arranged apart from the primary pedestal, and a Y-direction load receiver installed on the secondary pedestal in a manner movable in the X direction and immovable in the Y direction, in which the X-direction linear motor includes an X-direction stator attached to the secondary pedestal and an X-direction mover attached to an end portion of the gantry frame, and in which the Y-direction linear motor includes a Y-direction stator attached to the gantry frame in a manner movable in the Y direction and a Y-direction mover attached to the mounting head, the mounting apparatus further including a connection member connecting one end of the Y-direction stator and the Y-direction load receiver.

The mounting apparatus according to the present invention may preferably be arranged such that the mounting head, the gantry frame, and the Y-direction linear motor are each in plural, and each mounting head is supported on each gantry frame and driven by each Y-direction linear motor in the Y direction, and that the X-direction mover is attached to each end portion of each gantry frame and combined with the X-direction stator common to each end portion to form multiple X-direction linear motors on the respective end portions.

The mounting apparatus according to the present invention may preferably be arranged such that the Y-direction load receiver is in plural and installed on a common member of the secondary pedestal, and that the connection member is in plural and each connection member connects each Y-direction stator and each Y-direction load receiver.

The mounting apparatus according to the present invention may preferably further include position detection sensors for detecting the X-direction position of each X-direction mover with respect to the primary pedestal, and a control unit for feeding back X-direction position data of each X-direction mover detected by each position detection sensor to control the position of each X-direction mover.

The mounting apparatus according to the present invention may preferably further include position detection sensors for detecting the Y-direction position of each Y-direction mover with respect to the gantry frame supported on the primary pedestal, and a control unit for feeding back Y-direction position data of each Y-direction mover detected by each position detection sensor to control the position of each Y-direction mover.

The mounting apparatus according to the present invention may preferably be arranged such that the Y-direction stator is attached to the gantry frame via a connection structure having a Y-direction degree of freedom, and that the connection structure is a plate spring.

Advantageous Effect of the Invention

The present invention exhibits an effect that in the mounting apparatus for moving the multiple mounting heads in the XY directions, the vibration of the primary pedestal with the mounting stage installed thereon can be reduced. The present invention also exhibits another effect that in the mounting apparatus for moving the multiple mounting heads in the XY directions, the effect of movement of one of the mounting heads on the positions of the other mounting heads can be reduced.

DESCRIPTION OF EMBODIMENTS

Figure 1:
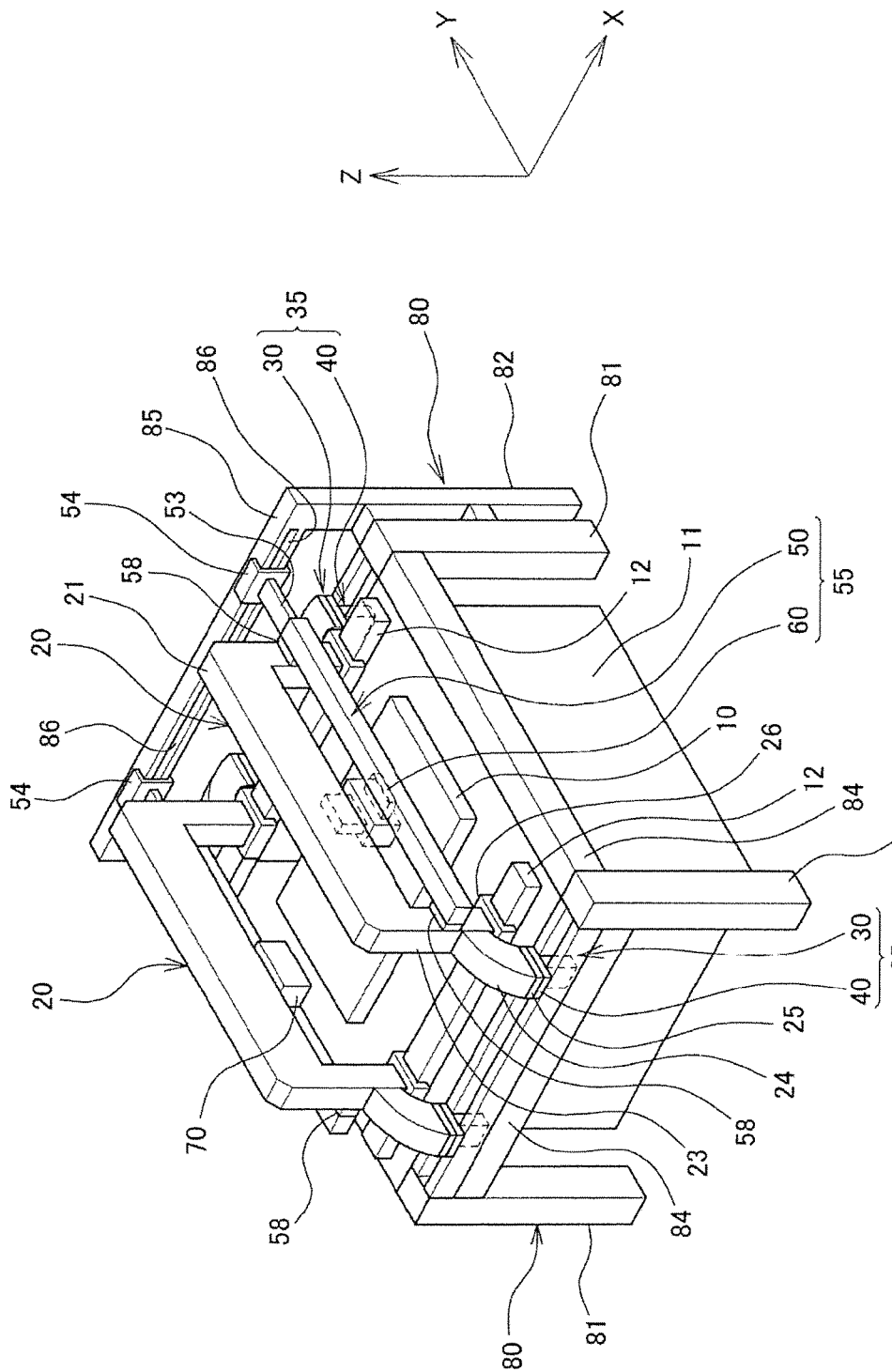
FIG. 1 is a perspective view showing a mounting apparatus according to an embodiment of the present invention.

A mounting apparatus according to an embodiment of the present invention will hereinafter be described with reference to the accompanying drawings. As shown in FIG. 1, the mounting apparatus 100 according to this embodiment includes a primary pedestal 11, a gantry frame 20 supported on the primary pedestal 11, a mounting head 70 supported on the gantry frame 20, an X-direction linear motor 35 for driving the gantry frame 20 in the X direction, a Y-direction linear motor 55 for driving the mounting head 70 in the Y direction, a secondary pedestal 80 arranged apart from the primary pedestal 11, and a Y-direction load receiver 54 installed on the secondary pedestal 80, in which one end of a Y-direction stator 50 of the Y-direction linear motor 55 and the Y-direction load receiver 54 are connected using a connection member 53. It is noted that the X direction and the Y direction are orthogonal to each other in a horizontal plane and, in the description of this embodiment, the direction in which the gantry frame 20 extends is the Y direction and the direction orthogonal to it is the X direction, as shown in FIG. 1. Also, the Z direction is a vertical direction perpendicular to the XY plane.

Figure 3:
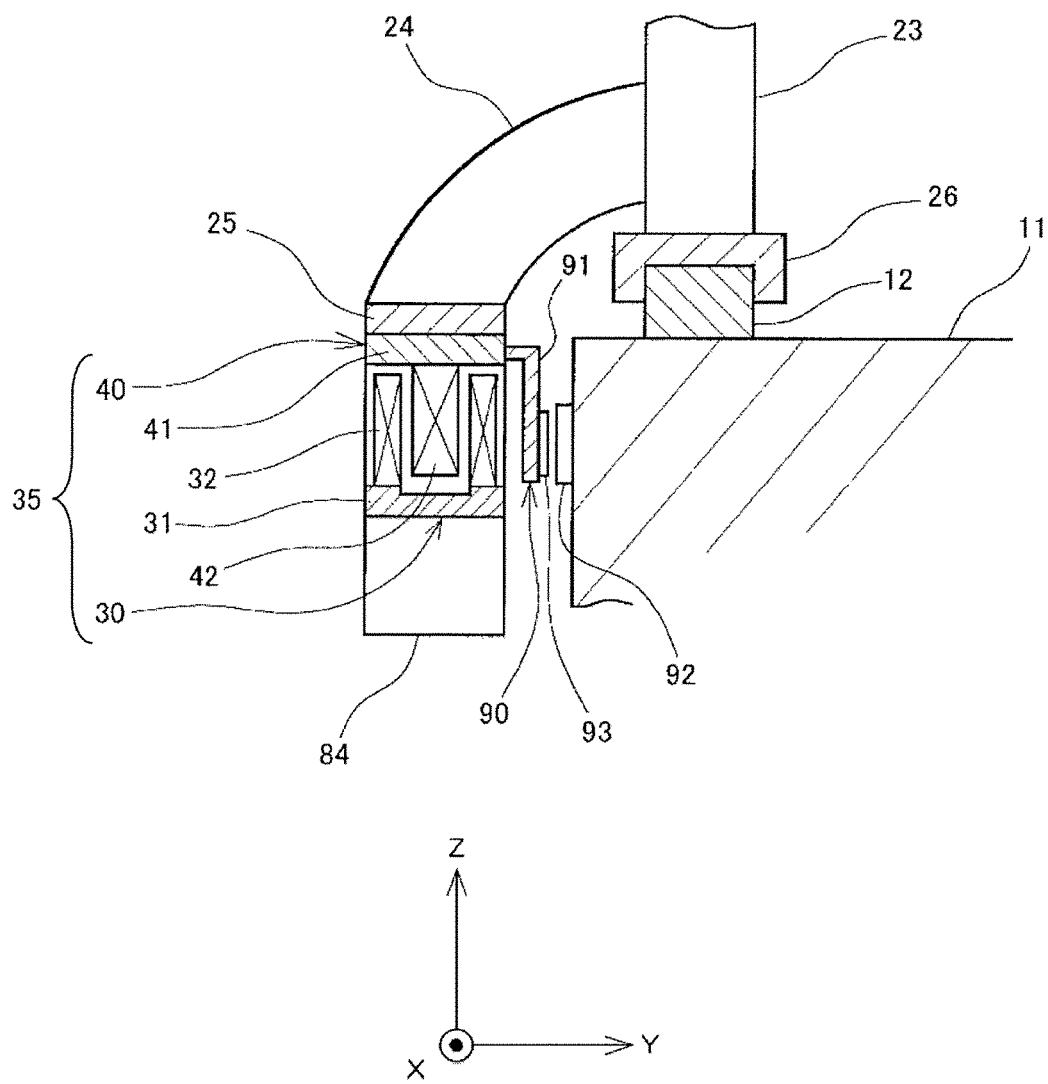
FIG. 3 is an illustrative view showing a cross-section of a support portion of a gantry frame and an X-direction linear motor of the mounting apparatus according to the embodiment of the present invention.

As shown in FIG. 1, the primary pedestal 11 is a pedestal having a quadrilateral plane, on which a mounting stage 10 is installed. The mounting stage 10 is arranged to vacuum-suck a substrate onto which a semiconductor die is to be mounted thereon. Linear guides 12 are installed in a mutually parallel manner in the respective vicinities of the two opposed sides of the upper surface of the primary pedestal 11. As shown in FIGS. 1 and 3, sliders 26 are installed on the linear guides 12 in a manner movable in the X direction. Leg portions 23 of the gantry frame 20 is installed on the sliders 26 of the two linear guides 12. That is, the gantry frame 20 extends across the primary pedestal 11 in the Y direction and is supported in a manner movable in the X direction on the linear guides 12, which are installed on the primary pedestal 11 with the leg portions 23 at the ends thereof being installed on the sliders 26.

As shown in FIG. 1, the mounting apparatus 100 of this embodiment also includes a secondary pedestal 80 arranged apart from the primary pedestal 11 in a manner surrounding the primary pedestal 11. The secondary pedestal 80 is a frame formed by columns 81 arranged on the outside of the four corners of the primary pedestal 11, columns 82 arranged positively in the Y direction with respect to the columns 81 as shown in FIG. 1, and beams 84 connecting the columns 81, 82. As shown in FIGS. 1 and 3, an X-direction stator 30 of the X-direction linear motor 35 is installed on the beams 84 that extend in the X direction. As shown in FIG. 3, the X-direction stator 30 includes permanent magnets 32 arranged in a manner spaced and opposed to each other on a support plate 31. The permanent magnets are reed-shaped, and a number of such permanent magnets are arranged in the X direction. A coil 42 of an X-direction mover 40 of the X-direction linear motor 35 is arranged in the space between the permanent magnets 32 of the X-direction stator 30. The coil 42 is arranged such that a very narrow gap is formed between the surface of the coil 42 and the surfaces of the permanent magnets 32. The coil 42 is fixed to an upper base plate 41, and the base plate 41 is fixed using a bolt or the like to a flat plate 25 attached to a leading end of an arm 24 that extends from each leg portion 23 of the gantry frame 20. Accordingly, the X-direction mover 40 of the X-direction linear motor 35 moves together with the gantry frame 20 in the X direction.

As shown in FIG. 1, two X-direction movers 40 are attached to one (common) X-direction stator 30. The portion in which the X-direction movers 40 of the common X-direction stator 30 are combined forms each X-direction linear motor 35. Accordingly, four X-direction linear motors 35 in total are carried in FIG. 1.

Also, as shown in FIG. 3, a fixed portion 92 of a linear encoder 90 extending linearly in the X direction is attached to the side of the primary pedestal 11 on which each X-direction mover 40 is arranged, while a movable portion 93 of the linear encoder 90 is attached to a leading end of an L-shaped lug 91 extending from the X-direction mover 40 toward the primary pedestal 11.

Figure 4:
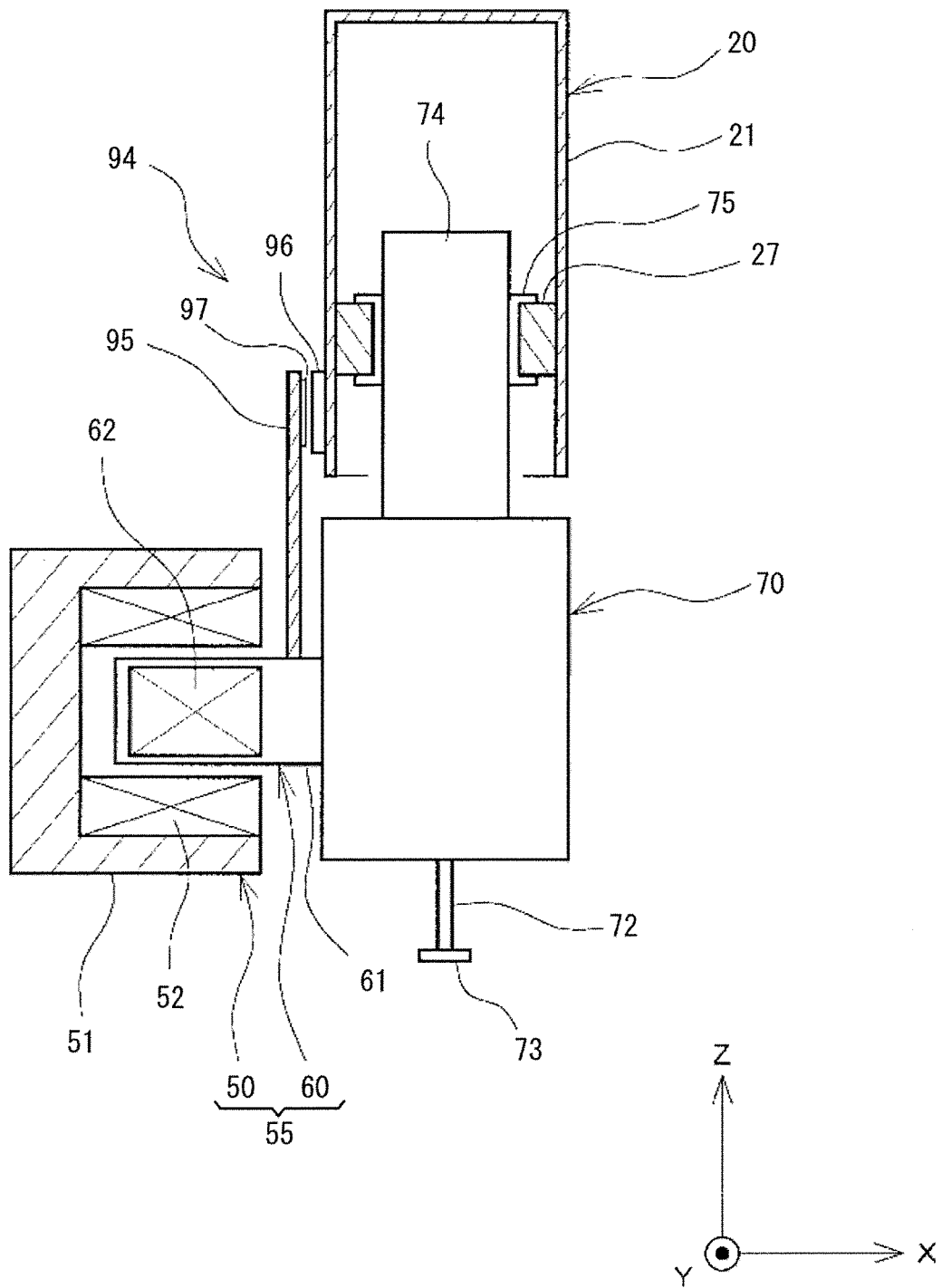
FIG. 4 is an illustrative view showing a cross-section of a mounting head attached to the gantry frame and a Y-direction linear motor of the mounting apparatus according to the embodiment of the present invention.

As shown in FIGS. 1 and 4, the mounting head 70 is supported on the gantry frame 20. As shown in FIG. 4, a Z-direction moving mechanism for moving, vertically in the Z direction, a shaft 72 with a mounting tool 73 attached to the leading end thereof is housed in the mounting head 70. The Z-direction moving mechanism is arranged to move the mounting tool 73 vertically to press the semiconductor die against the substrate that is sucked and fixed on the mounting stage 10. The gantry frame 20 has an internal space, and two linear guides 27 extending in the Y direction is attached to the inner surfaces on either side. Sliders 75 are attached to the respective linear guides 27, and a suspension member 74 for the mounting head 70 is attached to the two sliders 75.

Figure 2:
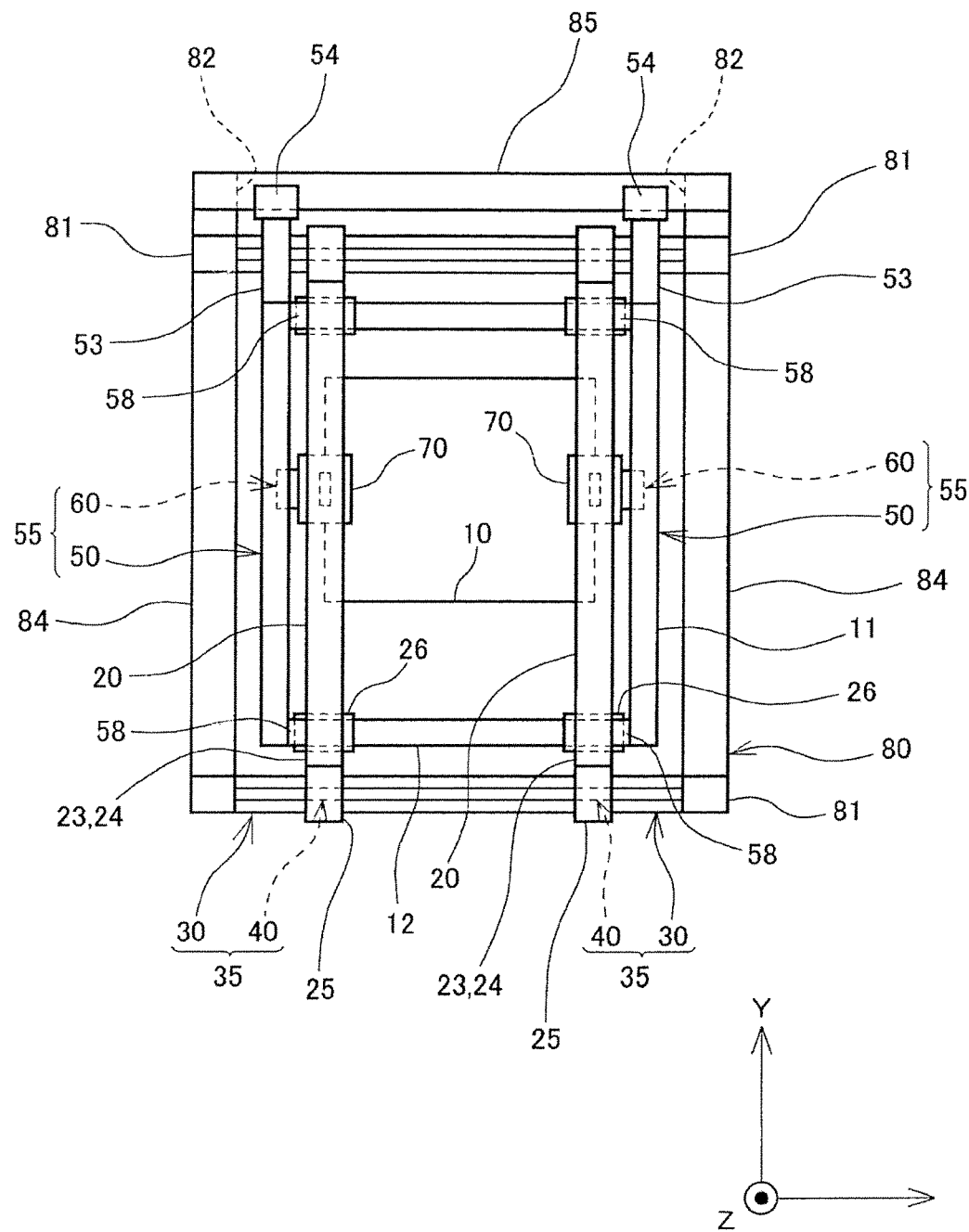
FIG. 2 is a plan view of the mounting apparatus according to the embodiment of the present invention.

As shown in FIGS. 1 and 2, the Y-direction stator 50 of the Y-direction linear motor 55 is attached in a manner movable in the Y direction between the leg portions 23 of the gantry frame 20 via a connection structure 58 having a Y-direction degree of freedom. The connection structure 58 is arranged to ensure a Y-direction degree of freedom for releasing a reaction force that the Y-direction stator 50 receives from a Y-direction mover 60 and may be, for example, a linear guide or a parallel link. As shown in FIG. 4, the Y-direction stator 50 includes permanent magnets 52 arranged in a manner spaced and opposed to each other in the interior of a groove-shaped frame 51, the ends of which are attached to each leg portion 23 via the connection structure 58. As is the case with the X-direction stator 30, the permanent magnets are reed-shaped, and a number of such permanent magnets are arranged in the Y direction. A coil 62 installed in a frame 61 extending from the mounting head 70 toward the Y-direction stator 50 is arranged in the space between the permanent magnets 52 of the Y-direction stator 50. The coil 62 is arranged such that a very narrow gap is formed between the surface of the coil 62 and the surfaces of the permanent magnets 52. Accordingly, the Y-direction mover 60 moves together with the mounting head 70 in the Y direction. As shown in FIGS. 1 and 2, the mounting apparatus 100 of this embodiment includes two gantry frames 20 to each of which the mounting head 70 and the Y-direction linear motor 55 are attached, that is, carries two Y-direction motors in total.

Also, as shown in FIG. 4, a fixed portion 96 of a linear encoder 94 extending linearly in the Y direction is attached to the outer surface of a casing 21 of the gantry frame 20, while a movable portion 97 of the linear encoder 94 is attached to a leading end of a lug 95 extending from the Y-direction mover 60 toward the casing 21.

As shown in FIGS. 1 and 2, the secondary pedestal 80 is attached with a beam 85 connecting, in the X direction, the columns 82 arranged positively in the Y direction. The height of the beam 85 is approximately the same as that of the Y-direction stator 50 attached to the gantry frame 20. Two linear guides 86 are attached to the side of the beam 85 negative in the Y direction. A Y-direction load receiver 54 is attached to each linear guide 86 in a manner slidable in the X direction. The Y-direction load receiver 54 and the Y-direction stator 50 are connected using the connection member 53. Since each linear guide 86 limits the movement of the Y-direction load receiver 54 positive and negative in the Y direction, the Y-direction load receiver 54 receives loads positive and negative in the Y direction from the Y-direction stator 50 and transmits them to the common beam 85.

As for the operation of the thus arranged mounting apparatus 100, mounting a semiconductor die onto a substrate sucked and fixed on the mounting stage 10 will be described as an example. The operation of the mounting apparatus 100 is controlled by a control unit not shown (the control unit is a computer including a CPU and a memory unit therein).

Once the semiconductor die is sucked to the leading end of the mounting tool 73, the control unit drives the X-direction linear motor 35 and the Y-direction linear motor 55 to move the mounting tool 73 of the mounting head 70 toward the mounting position on the substrate. In the case of movement of the mounting head 70 in the X direction, the position of the X-direction mover 40 detected by the linear encoder 90 is fed back and the energization of the coil 42 is controlled such that the X-direction mover 40 is moved in the X direction to a position directed by the control unit. This also causes the gantry frame 20 to move together with the X-direction mover 40 in the X direction. In contrast, the X-direction stator 30 is applied with a reaction force in the direction opposite to the direction of movement of the gantry frame 20 in the X direction. Since the X-direction stator 30 is fixed to the secondary pedestal 80, the reaction force is not transmitted to the primary pedestal 11. In addition, the Y-direction position of the Y-direction mover 60 detected by the linear encoder 94 shown in FIG. 4 is fed back and the energization of the coil 62 is controlled such that the Y-direction mover 60 is moved in the Y direction to a position directed by the control unit. This also causes the mounting head 70 to move together with the Y-direction mover 60 in the Y direction. In contrast, the Y-direction stator 50 is applied with a reaction force in the direction opposite to the direction of movement of the mounting head 70 in the Y direction. As described heretofore, since the Y-direction stator 50 is attached to the gantry frame 20 via the connection structure 58 in a manner movable in the Y direction, the reaction force applied to the Y-direction stator 50 is transmitted from the Y-direction stator 50 through the connection member 53 and the Y-direction load receiver 54 to the beam 85 of the secondary pedestal 80. That is, the Y-direction reaction force applied to the Y-direction stator 50 when the mounting head 70 moves together with the Y-direction mover 60 in the Y direction is transmitted not to the primary pedestal 11, but entirely to the secondary pedestal 80. Accordingly, in the mounting apparatus 100 of this embodiment, even when the mounting head 70 may be moved in the XY direction as directed by the control unit, the XY-direction reaction force is applied not to the primary pedestal 11, but to the secondary pedestal 80 arranged away from the primary pedestal 11, whereby the vibration of the primary pedestal 11 with the mounting stage 10 installed thereon can be reduced.

In the mounting apparatus 100 of this embodiment, two X-direction movers 40 are combined on the X-direction stator 30. That is, two X-direction movers 40 are combined with respect to one common X-direction stator 30. As mentioned above, even if the X-direction movers 40 may move, their reaction forces cannot be transmitted to the primary pedestal 11. However, when one of the X-direction movers 40 moves, its reaction force is applied to the frame of the secondary pedestal 80 to slightly deform the secondary pedestal 80. Since this slight deformation also causes the X-direction stator 30 attached to the secondary pedestal 80 to be displaced slightly, it may be conceivable that the movement of one of the X-direction movers 40 affects the position of the other X-direction mover 40.

However, the positioning of each X-direction mover 40 is feedback controlled based on a positional signal detected by the linear encoder 90, which is attached to the primary pedestal 11 insensitive to vibrations (displacements) when the X, Y-direction linear motors 35, 55 are driven. That is, since the position of each X-direction mover 40 is controlled with respect to the primary pedestal 11, the position detection and control are not affected at all even if the X-direction stator 30 may be displaced due to the displacement of the secondary pedestal 80. In addition, while a thrust variation (cogging) commonly occurs when driving the X-direction linear motor 35, the position control for each X-direction mover 40 can ensure a predetermined accuracy even when such a thrust variation (cogging) may occur. The slight displacement of the X-direction stator 30 causes a slight thrust change in each X-direction mover 40, but the amount of such a thrust change is as very small as one fifth to one tenth of the above-described common thrust variation and cannot affect the position control for each X-direction mover 40. Thus, in the mounting apparatus 100 of this embodiment, even if two X-direction movers 40 may be combined with respect to the common X-direction stator 30, each X-direction mover 40 can be positioned with a high degree of accuracy.

Further, in the mounting apparatus 100 of this embodiment, since Y-direction reaction forces from two Y-direction stators 50 are received by the beam 85 of the common secondary pedestal 80, when one of the Y-direction movers 60 moves, its reaction force is applied to the beam 85 of the secondary pedestal 80 to deform the beam 85 in the Y direction. Since this slight deformation also causes the other Y-direction stator 50 attached to the beam 85 to be displaced slightly, it may be conceivable that the movement of one of the Y-direction movers 60 affects the positional accuracy of the other Y-direction mover 60.

However, as is the case with the above-described positioning of each X-direction mover 40, the Y-direction position is feedback controlled based on a positional signal detected by the linear encoder 94, which is attached to the gantry frame 20 supported on the primary pedestal 11 insensitive to vibrations when the X, Y-direction linear motors 35, 55 are driven. That is, since the position of each Y-direction mover 60 is controlled indirectly with respect to the primary pedestal 11, the position detection and control are not affected at all even if the Y-direction stator 50 may be displaced due to the displacement of the secondary pedestal 80. Further, similarly to the foregoing description, the thrust change is as very small as one fifth to one tenth of the thrust variation during normal drive and cannot affect the position control. Thus, in the mounting apparatus 100 of this embodiment, even if one of the Y-direction movers 60 may move to slightly displace the other Y-direction stator 50 via the beam 85 of the secondary pedestal 80, the position detection and control are not affected at all, and even if the common beam 85 may receive the Y-direction reaction forces, each Y-direction mover 60 can be positioned with a high degree of accuracy.

As described heretofore, in the mounting apparatus 100 of this embodiment, which is arranged to move the multiple mounting heads in the XY directions, the effect of movement of one of the mounting heads 70 on the positions of the other mounting heads 70 can be reduced with a simple structure in which two X-direction movers 40 are combined with respect to the common X-direction stator 30 to form the X-direction linear motors 35 and reaction forces from the Y-direction stators 50 are received by the common beam 85.

Figure 5:
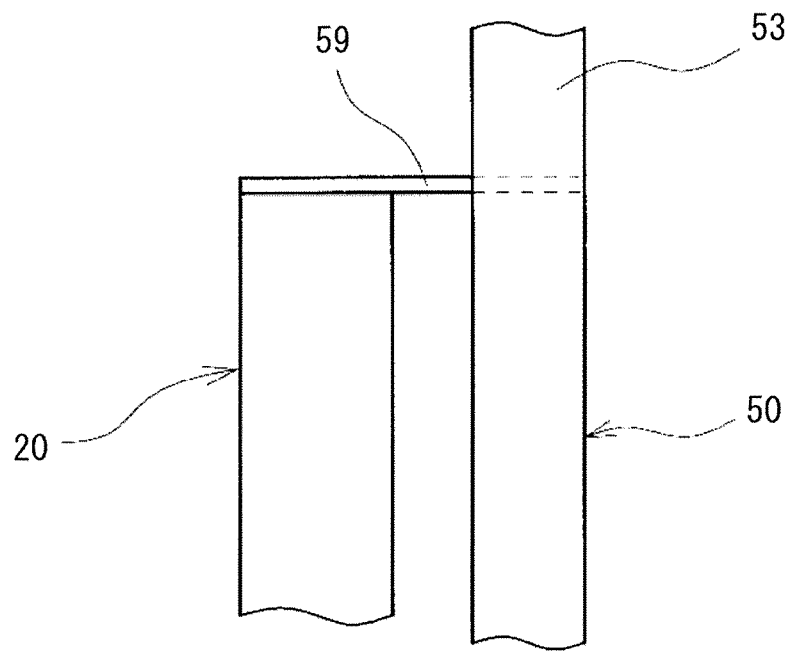
FIG. 5 is an illustrative view showing a connection of the gantry frame and a Y-direction stator of the mounting apparatus according to the embodiment of the present invention.
Figure 5:
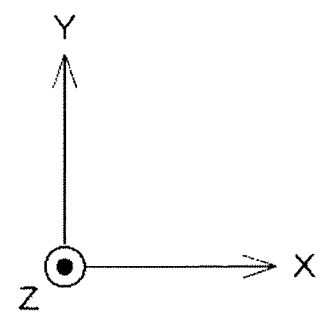

While in the above-described embodiment, the Y-direction stator 50 is attached to the gantry frame 20 via the connection structure 58 in a manner movable in the Y direction, a plate spring 59 may, for example, be installed to be thicker in the Y direction and, via the plate spring 59, the Y-direction stator 50 may be attached to the gantry frame 20, as shown in FIG. 5. With this arrangement, since the plate spring 59 has a very low stiffness in the Y direction, the reaction force applied to the Y-direction stator 50 when the mounting head 70 moves in the Y direction has little chance to be transmitted to the gantry frame 20. That is, the Y-direction stator 50 is attached to the gantry frame 20 in a manner substantially movable in the Y direction. This causes the reaction force applied to the Y-direction stator 50 to be transmitted almost entirely from the Y-direction stator 50 through the connection member 53 and the Y-direction load receiver 54 to the beam 85 of the secondary pedestal 80, thus having little chance to be transmitted to the primary pedestal 11. Accordingly, this embodiment is similar to the above-described embodiment in that even when the mounting head 70 may be moved in the XY direction, the XY-direction reaction force is applied not to the primary pedestal 11, but to the secondary pedestal 80 arranged away from the primary pedestal 11, whereby the vibration of the primary pedestal 11 with the mounting stage 10 installed thereon can be reduced.

The foregoing description of the exemplary embodiment of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A mounting apparatus comprising:
   a primary pedestal with a mounting stage installed thereon;
   a gantry frame extending in a Y direction across the primary pedestal with the ends thereof supported on the primary pedestal in a manner movable in an X direction;
   a mounting head supported on the gantry frame in a manner movable in the Y direction;
   an X-direction linear motor for driving the gantry frame in the X direction;
   a Y-direction linear motor for driving the mounting head in the Y direction;
   a secondary pedestal arranged apart from the primary pedestal; and
   a Y-direction load receiver installed on the secondary pedestal in a manner movable in the X direction and immovable in the Y direction, wherein
   the X-direction linear motor includes an X-direction stator attached to the secondary pedestal and an X-direction mover attached to an end portion of the gantry frame, and wherein
   the Y-direction linear motor includes a Y-direction stator attached to the gantry frame in a manner movable in the Y direction and a Y-direction mover attached to the mounting head,
   the mounting apparatus further comprising a connection member connecting one end of the Y-direction stator and the Y-direction load receiver.

2. The mounting apparatus according to claim 1, wherein the mounting head, the gantry frame, and the Y-direction linear motor are each in plural, and each mounting head is supported on each gantry frame and driven by each Y-direction linear motor in the Y direction, and wherein the X-direction mover is attached to each end portion of each gantry frame and combined with the X-direction stator common to each end portion to form a plurality of the X-direction linear motors on the respective end portions.

3. The mounting apparatus according to claim 2, wherein
the Y-direction load receiver is in plural and installed on a common member of the secondary pedestal, and wherein
the connection member is in plural and each connection member connects each Y-direction stator and each Y-direction load receiver.

4. The mounting apparatus according to claim 2, further comprising:
position detection sensors for detecting the X-direction position of each X-direction mover with respect to the primary pedestal; and
a control unit for feeding back X-direction position data of each X-direction mover detected by each position detection sensor to control the position of each X-direction mover.

5. The mounting apparatus according to claim 3, further comprising:
position detection sensors for detecting the X-direction position of each X-direction mover with respect to the primary pedestal; and
a control unit for feeding back X-direction position data of each X-direction mover detected by each position detection sensor to control the position of each X-direction mover.

6. The mounting apparatus according to claim 2, further comprising:
position detection sensors for detecting the Y-direction position of each Y-direction mover with respect to the gantry frame supported on the primary pedestal; and
a control unit for feeding back Y-direction position data of each Y-direction mover detected by each position detection sensor to control the position of each Y-direction mover.

7. The mounting apparatus according to claim 3, further comprising:
position detection sensors for detecting the Y-direction position of each Y-direction mover with respect to the gantry frame supported on the primary pedestal; and
a control unit for feeding back Y-direction position data of each Y-direction mover detected by each position detection sensor to control the position of each Y-direction mover.

8. The mounting apparatus according to claim 1, wherein the Y-direction stator is attached to the gantry frame via a connection structure having a Y-direction degree of freedom.

9. The mounting apparatus according to claim 6, wherein the connection structure is a plate spring.

* * * * *